(12) United States Patent
Schat

(10) Patent No.: US 10,613,926 B2
(45) Date of Patent: Apr. 7, 2020

(54) INTEGRATED CIRCUIT FAULT DETECTION

(71) Applicant: NXP B.V., Eindhoven (NL)

(72) Inventor: Jan-Peter Schat, Hamburg (DE)

(73) Assignee: NXP B.V., Eindhoven (NL)

(*) Notice: Subject to any disclaimer, the term of this patent is extended or adjusted under 35 U.S.C. 154(b) by 70 days.

(21) Appl. No.: 16/013,843

(22) Filed: Jun. 20, 2018

(65) Prior Publication Data
US 2019/0018731 A1 Jan. 17, 2019

(30) Foreign Application Priority Data

Jul. 11, 2017 (EP) .................................... 17180696

(51) Int. Cl.
| | |
|---|---|
| *G06F 11/10* | (2006.01) |
| *G01R 31/3181* | (2006.01) |
| *G01R 31/3185* | (2006.01) |
| *G11C 29/44* | (2006.01) |
| *G11C 29/34* | (2006.01) |

(Continued)

(52) U.S. Cl.
CPC ...... *G06F 11/1004* (2013.01); *G01R 31/3181* (2013.01); *G01R 31/318541* (2013.01); *G01R 31/318544* (2013.01); *G01R 31/318569* (2013.01); *G06F 9/30134* (2013.01); *G11C 29/34* (2013.01); *G11C 29/44* (2013.01); (Continued)

(58) Field of Classification Search
CPC . G06F 11/1004; G06F 9/30134; G11C 29/44; G11C 29/34; G11C 2029/3202; G11C 2029/1208; G01R 31/318544; G01R 31/318541; G01R 31/3181; G01R 31/318569
See application file for complete search history.

(56) References Cited

U.S. PATENT DOCUMENTS

| | | |
|---|---|---|
| 5,530,706 A | 6/1996 | Josephson et al. |
| 5,627,840 A | 5/1997 | Hundertmark et al. |

(Continued)

FOREIGN PATENT DOCUMENTS

EP 3296874 A1 3/2018

OTHER PUBLICATIONS

Imhof, M. et al. "Bit-Flipping Scan—A unified architecture for fault tolerance and offline test", Design, Automation & Test in Europe Conference & Exhibition (DATE), Dresden, pp. 1-6 (2014).

(Continued)

*Primary Examiner* — Thien Nguyen
(74) *Attorney, Agent, or Firm* — Rajeev Madnawat

(57) ABSTRACT

A method of detecting faults in a register bank is disclosed. The register bank includes at least one chain of registers. The method comprises sequentially shifting parameters stored in each register of the chain to an output node of the chain and inverting each parameter and feeding each parameter back to an input node of that chain, and sequentially shifting the inverted parameters through the chain until all the non-inverted parameters have been output at the output node. A first checksum of the parameters output at the output node is calculated. The inverted parameters in each register of the chain are sequentially shifted to the output node of the chain. A second checksum of the inverted parameters output at the output node is calculated, and the first and second checksums are compared.

12 Claims, 4 Drawing Sheets

(51) Int. Cl.
*G06F 9/30* (2018.01)
*G11C 29/32* (2006.01)
*G11C 29/12* (2006.01)

(52) U.S. Cl.
CPC ............... *G11C 2029/1208* (2013.01); *G11C 2029/3202* (2013.01)

(56) References Cited

U.S. PATENT DOCUMENTS

| | | | |
|---|---|---|---|
| 6,236,686 B1* | 5/2001 | Kamishima | H03M 5/00 |
| | | | 341/58 |
| 7,451,387 B2 | 11/2008 | Koktan et al. | |
| 2005/0257107 A1 | 11/2005 | Kim | |
| 2005/0289436 A1 | 12/2005 | Redford | |
| 2008/0255780 A1 | 10/2008 | Waayers | |
| 2010/0269004 A1* | 10/2010 | Flynn | G06F 11/10 |
| | | | 714/746 |
| 2015/0046416 A1* | 2/2015 | Cordes | H04L 9/065 |
| | | | 707/696 |
| 2015/0067425 A1 | 3/2015 | Kim | |
| 2016/0266836 A1* | 9/2016 | Tran | G06F 9/44 |
| 2018/0059180 A1* | 3/2018 | Rangachari | G01R 31/31701 |

OTHER PUBLICATIONS

Arslan, B. et al. "Circularscan: a scan architecture for test cost reduction", Proceedings Design, Automation and Test in Europe Conference and Exhibition, pp. 1290-1295 vol. 2. (2004).

Azimipour, M. et al. "A parallel Circular-Scan architecture using multiple-hot decoder", 15th International Conference on Mixed Signal Design of Integrated Circuits and Systems, Poznan, Poland, pp. 475-480 (2008).

Somnath, P. et al. "Vim-Scan: A Low Overhead Scan Design Approach for Protection of Secret Key in Scan-Based Secure Chips", IEEE VLSI Test Symposium (VTS'07), Berkeley, CA, pp. 455-460 (2007).

\* cited by examiner

INTEGRATED CIRCUIT FAULT DETECTION

CROSS-REFERENCE TO RELATED APPLICATIONS

This application claims the priority under 35 U.S.C. § 119 of European Patent application no. 17180696.1, filed on Jul. 11, 2017, the contents of which are incorporated by reference herein.

FIELD

The disclosure relates to a method of detecting faults in register banks of integrated circuits.

BACKGROUND

The function of integrated circuits (ICs) can be disturbed by transient faults, also known as Single Even Upsets (SEUs) or soft errors. These are mainly due to secondary atmospheric neutrons caused by cosmic radiation. Transient faults flip the state of a single register, until the state of this register is re-written.

Another fault class is stuck-at faults. These tie a node permanently to 0 or 1. They may be caused by metal particles that short a node to a ground or a supply wire. Most ICs with a stuck-at fault are screened out in the production test, but in some ICs the fault becomes active only after some time of operation in the field.

For an IC in safety-critical systems, such as automotive systems, a malfunction caused by a stuck-at or a transient fault might endanger a person's safety, so measures are required to detect and mitigate possible impairments by such faults.

Automotive standards like ISO 26262 require manufacturers to prove that a certain percentage of safety-critical faults are detected and mitigated. This percentage is called "Diagnostic Coverage" and must be at least 90% to 99%, depending on the safety level of the device (ASIL, Automotive Safety Integrity Level).

The conventional method of detecting stuck-at faults uses a Scan-BIST (Built-In Self-Test). This is a scan test where all necessary logic to create and compare scan patterns is implemented on-chip. As Scan-BIST overwrites all registers values, they need to be restored after each BIST run. Moreover, the area needed for the additional on-chip hardware is relatively large.

SUMMARY

In accordance with an aspect of the present disclosure there is provided a method of detecting faults in a register bank, the register bank comprising at least one chain of registers, the method comprising:
(i) sequentially shifting parameters stored in each register of the chain to an output node of the chain;
(ii) inverting each parameter and feeding each parameter back to an input node of that chain;
(iii) repeating steps (i) and (ii) to sequentially shift the inverted parameters through the chain until all the non-inverted parameters have been output at the output node;
(iv) calculating a first checksum of the parameters output at the output node;
(v) sequentially shifting the inverted parameters in each register of the chain to the output node of the chain;
(vi) inverting each inverted parameter to restore the non-inverted parameters, feeding each non-inverted parameter back to the input node of that chain;
(vii) repeating steps (v) and (vi) to sequentially shift the non-inverted parameters through the chain until all the inverted parameters have been output at the output node;
(viii) calculating a second checksum of the inverted parameters output at the output node; and
(ix) comparing the first and second checksums.

The or each chain of registers may comprise a plurality of registers serially connected in a chain, each register of the chain of registers configured to store a parameter in use, the or each chain of registers having an input node at a first end of the chain and an output node at an, opposed, second end of the chain, the register bank including a scan chain arrangement configured to provide for sequential output, at the output node, of the parameters stored in the registers of the chain by way of sequentially shifting the parameters stored in each register of the chain to an adjacent register in the chain in a direction of the output node. In particular, each chain may comprise one or more shift registers connected in a scan chain arrangement. The registers may be connected in the scan chain arrangement only when the method is to be performed.

The method provides a scan of a register bank that is sensitive to stuck-at faults. In contrast to the conventional self-GIST scans, the original data is restored at the end of the test.

In some embodiments, calculating the first checksum may comprise processing the parameters using a linear checksum algorithm; and calculating the second checksum may comprise processing the inverted parameters with the linear checksum algorithm. The linear algorithm may for example comprise a cyclic redundancy check (CRC) or a Hamming code. Other algorithms may be used. For example, a non-linear algorithm may be used, with an inverter selectively placed before the checksum encoder to invert either the parameters or the inverted parameters before they reach the encoder and the checksum is calculated.

In embodiments using a linear checksum algorithm, comparing the first and second checksums may comprise:
determining if the second checksum is the inverse of the first checksum; and
if the second checksum is not the inverse of the first checksum, determining that a fault exists in the chain. In particular, it may be determined that a stuck-at fault exists in the chain.

Correspondingly, if the second checksum is the inverse of the first checksum, it may be determined that a fault does not exist in the chain In some embodiments the method may further comprise comparing the first checksum to a previously calculated first checksum. This comparison may be used to determine if a transient fault exists in the register. In particular, comparing the first checksum to the previously calculated first checksum may comprise determining if the first checksum is equal to the previously calculated first checksum; and if the first checksum is not equal to the previously calculated first checksum, determining that a fault exists in the chain.

In some embodiments, the register bank may comprise a plurality of chains of registers. In such embodiments, calculating the first and second checksums may comprise calculating first and second checksums for each chain. Alternatively, calculating the first check sum may comprise calculating a checksum of the parameters output at the output nodes of all the chains, and calculating the second checksum may comprise calculating a checksum of the inverted parameters output at the output nodes of all the chains.

In embodiments where the register bank comprises a plurality of chains of registers, the method may be performed for all chains in the plurality of chains, or a subset of the chains. In particular, the method may be performed simultaneously on all the chains/the subset of chains.

In some embodiments, the method may be performed after writing data to the register bank, and/or after a predetermined period of time has elapsed since the method was last performed.

According to a second aspect of the disclosure there is provided an apparatus comprising:

a register bank comprising at least one chain of registers comprising a plurality of registers serially connected in a chain, each register of the chain of registers configured to store a parameter, the or each chain of registers having an input node at a first end and an output node at an opposed second end of the chain;

a feedback arrangement comprising an inverter, the feedback arrangement configured such that each parameter provided at the output node is fed back via the inverter to the input node of that chain; and an encoder configured to calculate a checksum of the parameters of the at least one chain of registers provided at the output node;

wherein the apparatus is configured to perform the method according to the first aspect of the disclosure.

In some embodiments, the apparatus may further comprise a controller configured to receive the first and second checksum from the encoder, and to compare the first and second checksums. The controller may be a hypervisor.

In some embodiments the apparatus may further comprise at least one register controlled block comprising an electronic device configured to perform a predetermined task based on the parameters stored in at least one register of the at least one chain of registers.

In some embodiments, the apparatus may be configured to provide an application mode in which the parameters of the registers are provided for control of one or more electronic devices; and a register contents integrity test mode in which the method of any embodiment of the first aspect is performed.

In some embodiments, the electronic device may comprise one or more of:
  an automotive electronic device;
  an automotive driver assistance electronic device;
  an automotive based radar device;
  an interface for manipulation of data passing through the interface;
  an analogue electronic device such as an amplifier;
  an analogue/mixed signal block comprising one or more of an analogue to digital converter, a phase locked loop and a digital to analogue converter;
  a state machine;
  a decimation filter;
  an encoder;
  a decoder;
  an encryption element;
  a decryption element and;
  an error detection/correction element.

In some embodiments the register bank may comprise a plurality of chains of registers, the plurality of chains connected in parallel.

In some embodiments the registers of the at least one chain of registers may comprise one or more of flip-flops, latches, and dynamic storage elements.

In some embodiments the apparatus may be configured to receive a clock signal for sequential output of the parameters from the at least one chain of registers.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
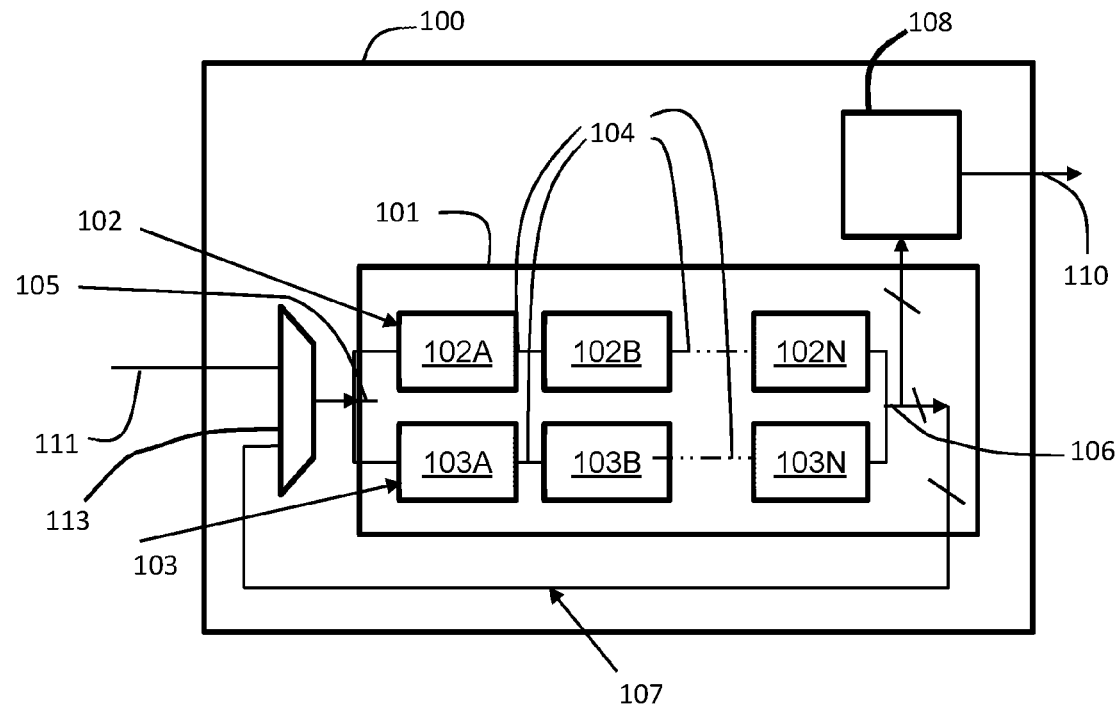
FIG. 1 illustrates an example scan chain apparatus for detecting transient faults.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

The functionality of electronic devices may be controlled by parameters stored in registers. Typically, an electronic device may include many settings requiring many registers in which to store the parameters. The reliability of the data stored in the registers is important as it may affect the operation of the electronic device. The integrity of the registers and the parameters stored therein may be particularly important when the electronic device comprises a safety-critical electronic device. An example of such a safety critical electronic device may be a driver assistance electronic device (or circuitry or a module of the same) for providing at least partial control of an automobile and/or assistance to a driver.

While this disclosure may relate to an automotive based electronic device, the determination of unintended changes to parameters in a register bank may be applicable to register banks in general for any particular use. Examples of electronic devices that may use such a register bank include an interface for manipulation of data passing through an interface; an analogue electronic device such as an amplifier; an analogue/mixed signal block comprising one or more of an analogue-to-digital converter, a phase locked loop and a digital to analogue converter; a state machine; a decimation filter; an encoder; a decoder; an encryption element; a decryption element; and an error detection/correction element. Each of the above listed devices may require or operate based on one or more settings that are defined by the parameters stored in the registers. For example, the action of a filter to filter an input signal and generate an output signal may be defined by the parameters.

The registers may be provided in banks comprising at least 5, 500, 1000, 2000, 5000, 10000 or more registers. Each register may comprise a flip-flop, latch, RAM cell, dynamic storage element such as a capacitor or other data storage element.

The function of an electronic device can be disturbed by unintended changes to the parameters stored in the register bank that are used by the electronic device to perform its function.

In our co-pending application, EP16189219.5, which is hereby incorporated by reference, a method and apparatus are described for determining transient faults in such register banks. FIG. 1 shows an embodiment of this apparatus.

FIG. 1 shows an apparatus 100 comprising a register bank 101. The register bank includes a plurality of registers 102A-N, 103A-N for storing parameters for use by an electronic device that connects to the register bank 101.

The register bank 101 comprises at least one chain of registers and in this example two chains are provided comprising a first chain 102 and a second chain 103. Each chain of registers 102, 103 comprises a plurality of registers serially connected in a chain-like manner. The first chain comprises registers 102A, 102B and so forth until 102N. The second chain comprises registers 103A, 103B and so forth until 103N. It will be appreciated that the chains of registers 102, 103 may be of any length depending on the number of parameters required to be stored. In this example, the first and second chains of registers 102, 103 both include the same number of registers, but in other examples may have different numbers of registers. Each chain is formed by the registers being connected together in series by logic elements 104, which collectively form, in part, a scan chain arrangement. The one or more chains of registers have input nodes 105 at a first end of the chains 102, 103 and output nodes 106 at an, opposed, second end of the chains 102, 103. In this example, in the figures, the input node 105 and the output node 106 are shown as being shared by the plurality of chains of registers for simplicity but, in fact, each chain of registers 102, 103 have their own input and output nodes 105, 106. In other examples, one or more of the input nodes and output nodes for a plurality of chains of registers may be shared and the signals multiplexed and de-multiplexed accordingly. However, in this example, the output from the scan chain arrangement is the parameters from the M chains of registers over M data lines (from M output nodes).

The register bank 101 includes a scan chain arrangement, embodied as the hardware logic elements 104, configured to provide for sequential output, at the output nodes 105, of the parameters stored in the registers of the chain by way of sequentially shifting the parameters stored in each register 102A-N, 103A-N of the chain 102, 103 to their respective adjacent register in the chain in the direction of the output nodes 106. As each parameter reaches the final registers 102N, 103N in the chain it is then output from the chain. In this example, the register bank 101 includes a plurality of chains of registers and the scan chain arrangement is configured to provide an output signal at the output nodes 106 comprising the parameters of the registers of each of the plurality of chains of registers. A hardware based scan chain arrangement may provide for efficient output of the parameters.

The scan chain arrangement is not shown in detail as such structures are known to those skilled in the art. However, in principle, the scan chain arrangement may provide a scan process of all the registers by performing a plurality of shift actions such that the parameters of each register is shifted along the chain to be output at the output node after at least a number of shift actions equal to the number of registers in the chain. The scan chain arrangement includes the connections (e.g. wires) 104 between the registers providing for shifting of a parameter stored in a first register, register 102A for example, to an adjacent register, register 102B for example, such that all the parameters in all of the registers of the chain move along the chain from register to adjacent register until they are output at the output nodes 106. The scan chain arrangement typically receives a clock signal to synchronise the shifting of parameters along the chain of registers. The scan chain arrangement therefore performs a plurality of shift actions, which may be equal to the number of registers in the chain in order to provide for output of every parameter stored in the registers of the chain.

The apparatus 100 of the example further includes a feedback arrangement 107 configured such that each parameter provided at the output nodes 106 is fed back to the input nodes 105 thereby providing for restoration of the parameters stored in the chain of registers 102, 103 once the scan chain arrangement has provided for output of all of the parameters of the chain and completed the scan process. Thus, as the action of the scan chain arrangement is to shift parameters stored in each register of the chain towards the output nodes 106, providing each parameter output at the output nodes 106 at the input nodes 105 will result in the original parameters being stored in the appropriate register once the scan chain arrangement has completed the same number of shifts as there are registers in the chain. Accordingly, a parameter fed back to the input will be shifted along the chain by the scan chain arrangement. With an appropriate number of shift actions, the parameter may be placed in the register it was stored in prior to the initiation of the scan process.

In one or more examples, the parameter of register 102N, 103N may be fed back to the input nodes 105 on a first shift action by the scan chain arrangement. In other examples, it may require more shift actions than there are registers in a chain to restore the or each chain of registers to its previous state before the scan-chain arrangement began its serial output of parameters. For example, the first parameter output by the scan chain arrangement may be stored in a buffer over one clock cycle (for example) prior to being fed back to the input nodes 105 on the next shift action. In such an example, it will require N+1 shifts by the scan chain arrangement to restore a chain of registers of N registers. Regardless of the number of shifts required, the feedback arrangement 107 provides for restoration of the parameters in the or each chain of registers as part of the scan process performed by the scan chain arrangement to read-out the parameters of the chain. The example apparatus 100 also includes a scan input line 111, multiplexed with the feedback line 107 at multiplexer 113. The scan input line 109 may be used to input data into the registers.

The apparatus 100 further comprises a checksum determination element 108. The checksum determination element 108 receives the signals from the output nodes 106. The checksum determination element 108 is configured to calculate a checksum of the parameters of the chain of registers provided at the output node by the scan chain arrangement for identification of changes to the parameters of the at least one chain of registers. Thus, the plurality of parameters upon which the checksum is calculated may comprise all of the parameters of one of the chains, a predefined part of the chain, a combination of parameters from two or more of the plurality of chains or any other combination of the registers that form the chains. In this example a single checksum is calculated for all of the registers 102A-N, 103A-N in all of the chains of registers, although in other examples a checksum may be calculated on a different basis, such as for each chain.

The checksum determination element 108 may use any checksum determination function such as a longitudinal parity, longitudinal redundancy check, modular sum, Fletcher's checksum, Adler-32 or a Cyclic Redundancy Check.

The determination of whether or not an unexpected change in the parameters of the registers has occurred may be performed by the checksum determination element or a hypervisor (not shown) which provides for control of at least the apparatus 100 or supervises the operation of the apparatus 100. Accordingly, in one or more examples, the checksum determination element 108 may include a memory for storing a previously calculated checksum, such as a most recent previously calculated checksum. The checksum determination element 108 may include a comparator for comparing a current checksum with the previously calculated checksum. If a difference is present, the checksum determination element 108 may provide or withhold signalling via output 110 to the hypervisor (i.e. a supervisory entity) to indicate the occurrence of a change in the checksum. In one or more examples the checksum determination element may provide signalling representative of the checksum it has calculated to the hypervisor via output 110. The hypervisor may then determine whether or not an unexpected change in the checksum, and therefore the parameters of the registers, has occurred.

On determination of an unexpected change to parameters due to a change in the checksum, the hypervisor may take action such as by providing for writing, to the plurality of registers, of the correct parameters. In other examples, the hypervisor may reset the system of which the apparatus 100 forms part to reinitialise the register bank 101. Write logic may be typically used to purposely change the register values during normal use. However, in this example it may also be used on identification of an unexpected change to restore the correct parameter(s).

The apparatus 100 can thus be used to determine transient faults by comparing a first checksum to a previously measured checksum. If these checksums are different, it is determined that a fault is present. Apparatus 100 can determine transient faults with a 100% diagnostic coverage. However, it cannot identify all stuck-at faults, as illustrated by FIG. 2.

Figure 2:
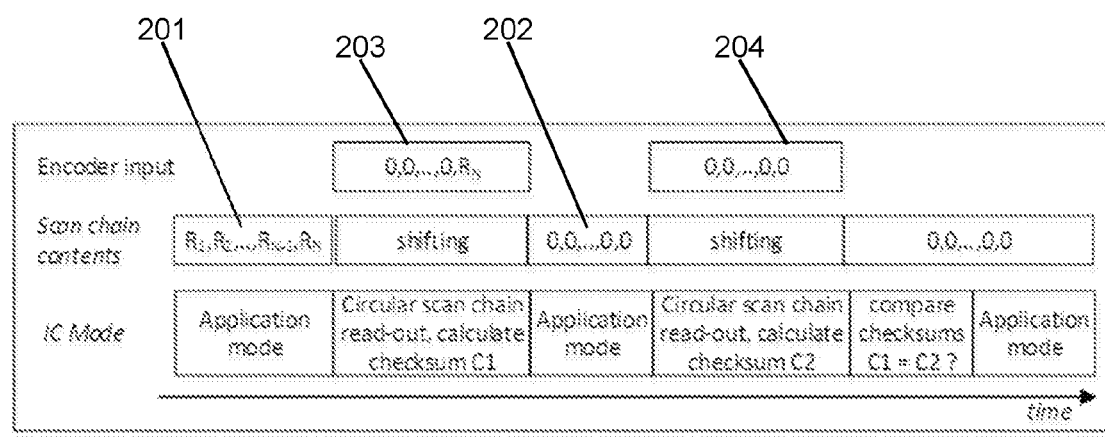
FIG. 2 illustrates the contents of the scan chain apparatus of FIG. 1 if a stuck-at fault is present.

FIG. 2 shows the contents of a single scan chain (e.g. chain 102) before (contents 201) and after (contents 202) a first scan and a subsequent second scan for the case where a stuck-at 0 fault exists between register N−1 and register N. Initial chain contents 201, $R_1$ to $R_N$ are shifted through the chain towards the output node 105, passing the stuck-at fault. As a result of the stuck-at 0 fault, all contents except $R_N$ are pinned to zero before being output. The input 203 to the checksum determination element 108 thus comprises zero for every parameter except $R_N$, and a checksum $C_1$ is determined based on that input 203.

The feedback arrangement 107 restores the faulty parameters to the chain. As the parameter $R_N$ passes the stuck-at 0 fault in the process of being restored to its original position in the chain, this parameter is also pinned to 0. Thus at the end of the scan, the parameters of the chain are all 0. The IC then returns to an application mode, where applications that use the register bank are run.

After a certain period of time, the scan is re-run with the new, all-zero, chain contents 202. This time, the stuck-at 0 fault does not affect the contents as they shift past the fault (as they are already 0), so the input 204 to the checksum also contains all zeros. A checksum $C_2$ is determined based on input 204, and compared to $C_1$.

The only difference between inputs 203 and 204 is $R_N$. If $R_N$ is 1, then the checksums will not match, indicating a fault. On the other hand, if $R_N$ is 0, the two inputs will match, so the checksums $C_1$ and $C_2$ will match. The apparatus 100 will not identify that a fault is present, even though all the contents of the chain have been wrongly over-written.

Figure 3:
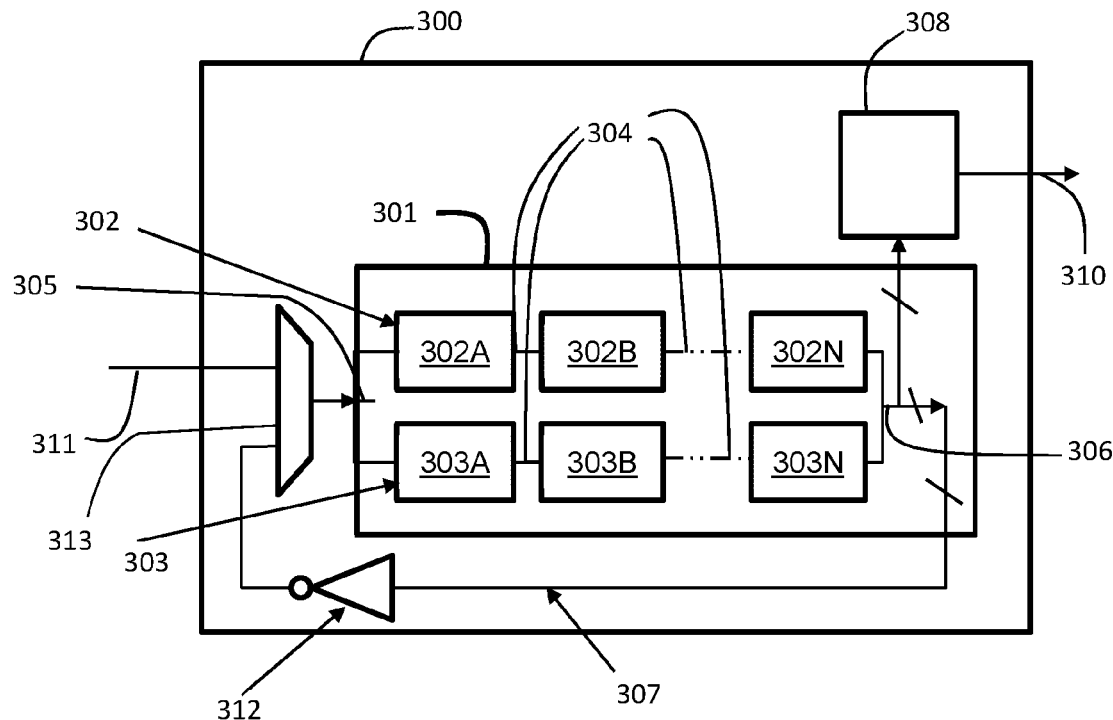
FIG. 3 illustrates an example scan chain apparatus according to the present disclosure for detecting stuck-at faults.

FIG. 3 shows an alternative apparatus 300 that may be used to detect both transient faults and stuck-at faults with the diagnostic coverage required by the ASIL D regulations. Apparatus 300 is, to a large extent, similar to apparatus 100. In FIG. 3, features which are identical to those of apparatus 100 have been labelled with reference labels which correspond to those in FIG. 1 (for example chain 302 in FIG. 3 corresponds to chain 102 in FIG. 1 and also corresponding between FIGS. 1 and 3 are output node 106 and output node 306, scan input line 111 and scan input line 311, register banks 101 and 301, and multiplexers 113 and 313).

In contrast to apparatus 100, the feedback arrangement 307 of apparatus 300 comprises an inverter 312. The inverter 312 flips any parameter passing through it to the opposite value (i.e. 0 is flipped to 1, 1 is flipped to 0).

In operation, a first scan is performed by shifting the parameters in the chains 302, 303, as for apparatus 100 above, to determine a first checksum. The parameters are fed back to the input node 305 via the feedback arrangement 307. The inverter 312 inverts each parameter before it reaches the input node 305 via multiplexer 313, so that when the first scan has completed, the chains 302, 303 should contain inverted parameters relative to their original contents (in the absence of a stuck-at fault).

A second scan is immediately performed, determining a second checksum based on the inverted parameters. The inverted parameters are fed back into the chains 302, 303 via feedback arrangement 307, being inverted by the inverter 312 before arriving at the input node 305. Inverting the inverted parameters restores their original values, so that at the end of the second scan (and in the absence of a stuck-at fault), the contents of the chains 302, 303 should be restored to their original values.

Stuck-at faults are identified by comparing the first and second checksums. The checksum determination element 308 of this embodiment uses a linear algorithm (e.g. a cyclic redundancy check, CRC) to calculate the checksums. Due to the linearity of this algorithm, inverting the checksum input will also invert the checksum output. Thus, in the absence of a stuck-at fault (which would alter the parameters during the shifting of the scan), the second checksum should be the inverse of the first. If this is not the case, the apparatus 300 determines that a stuck-at fault is present. Apparatus 300 can also identify transient faults by comparing the first checksum to a previous first checksum calculated during a previous scan, similarly to apparatus 100 above.

Figure 4:
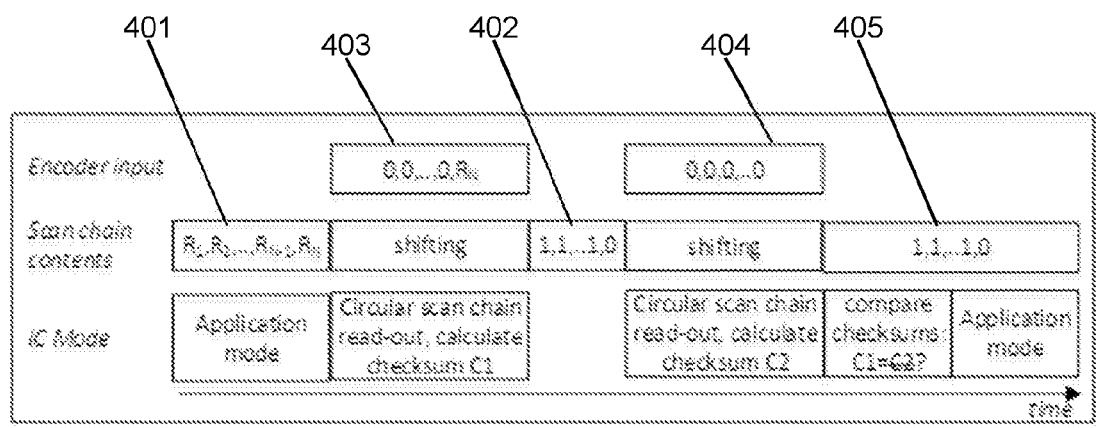
FIG. 4 illustrates the contents of the scan chain apparatus of FIG. 3 if a stuck-at fault is present.

FIG. 4 illustrates how apparatus 300 may be used to identify a stuck-at fault in the scenario discussed with FIG. 2, i.e. a stuck-at 0 fault between register N−1 and register N.

In this case, the original chain contents 401 and checksum input 403 are identical to contents 201 and input 203 in FIG. 2. In contrast to FIG. 2, the apparatus 300 inverts the parameters being fed back into the chain 302, so that chain contents 302 after the first scan comprise all 1's, except for the Nth parameter. The Nth parameter passes the stuck-at 0 fault when shifting through the chain back to its original position, so is pinned at zero.

A second scan is immediately performed, shifting each parameter (except the Nth parameter) past the stuck-at 0 fault. The second checksum input thus comprises all zeroes (as did input 204). The parameters are restored to the chain via the inverter 308 (and using wired connections 304 between scan chain registers), leading to the final chain contents 405, which are identical to contents 402 (due to the inverter 308 and the stuck-at fault pinning the Nth parameter).

The first and second checksums are calculated from first input 403 and second input 404 respectively. Due to the stuck-at fault, input 403 is not the inverted form of input 401. The second checksum is therefore not the inverse of the first checksum, and so apparatus 300 is able to determine that a stuck-at fault exists.

Thus apparatus 300 can detect stuck-at faults with the same diagnostic coverage as transient faults. Indeed, the diagnostic coverage of apparatus 300 for both fault types may be 100%.

The combination of determination of the checksums and the feedback to restore the state of the registers following the full (double) scan chain read out of the values provides a synergistic benefit of reducing bandwidth requirements between the apparatus 100 and a hypervisor (or controller) such that transient errors and stuck-at faults can be detected on short timescales with low hardware requirements. The feedback arrangement 307 obviates the need for the hypervisor to re-write the parameters to the registers following a scan chain read out and the determination of the checksums obviates the need to send the parameters (which may total many thousand) to the hypervisor. Accordingly, data flow from the hypervisor to the apparatus 300 and from the apparatus 300 to the hypervisor may be reduced while making efficient use of a scan-chain arrangement.

Figure 5:
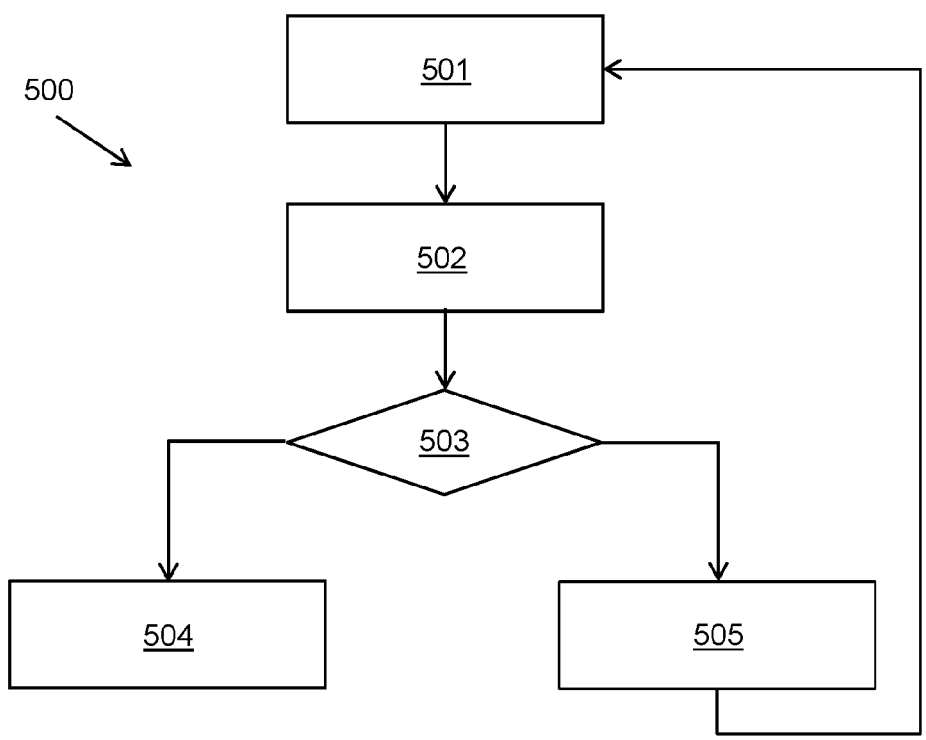
FIG. 5 illustrates an example method of detecting faults in a register bank.

FIG. 5 shows a flow chart illustrating an example method 500 of detecting faults in a register bank, for example using the apparatus 300.

At step 501, a first circular scan chain read-out is performed (i.e. shifting the parameter to an output of the register bank/chain, inverting the parameters, and feeding the inverted parameters back into the chain, as described above), and a first checksum calculated.

At step 502, a second circular scan chain read-out is performed (i.e. shifting the inverted parameters to the output, inverting the inverted parameters, and feeding the now non-inverted parameters back into the chain to restore the original contents of the chain, as described above), and a second checksum calculated.

At step 503, it is determined whether the second checksum equals the inverse of the first check sum. If the second checksum does not equal the inverse of the first checksum, the method moves to step 504, wherein it is determined that a stuck-at fault exists in the register bank or in a specific register chain (if separate checksums are calculated for each register chain). Corrective measures may be taken, such as disabling any device which relies on the register bank or specific register chain containing the fault.

Alternatively, if the second checksum does equal the inverse of the first check sum, the method 500 may proceed to step 505, where the IC returns to an application mode, and the method 500 may be re-run, for example after a set period of time or after new data has been written to one or more registers in the bank.

Figure 6:
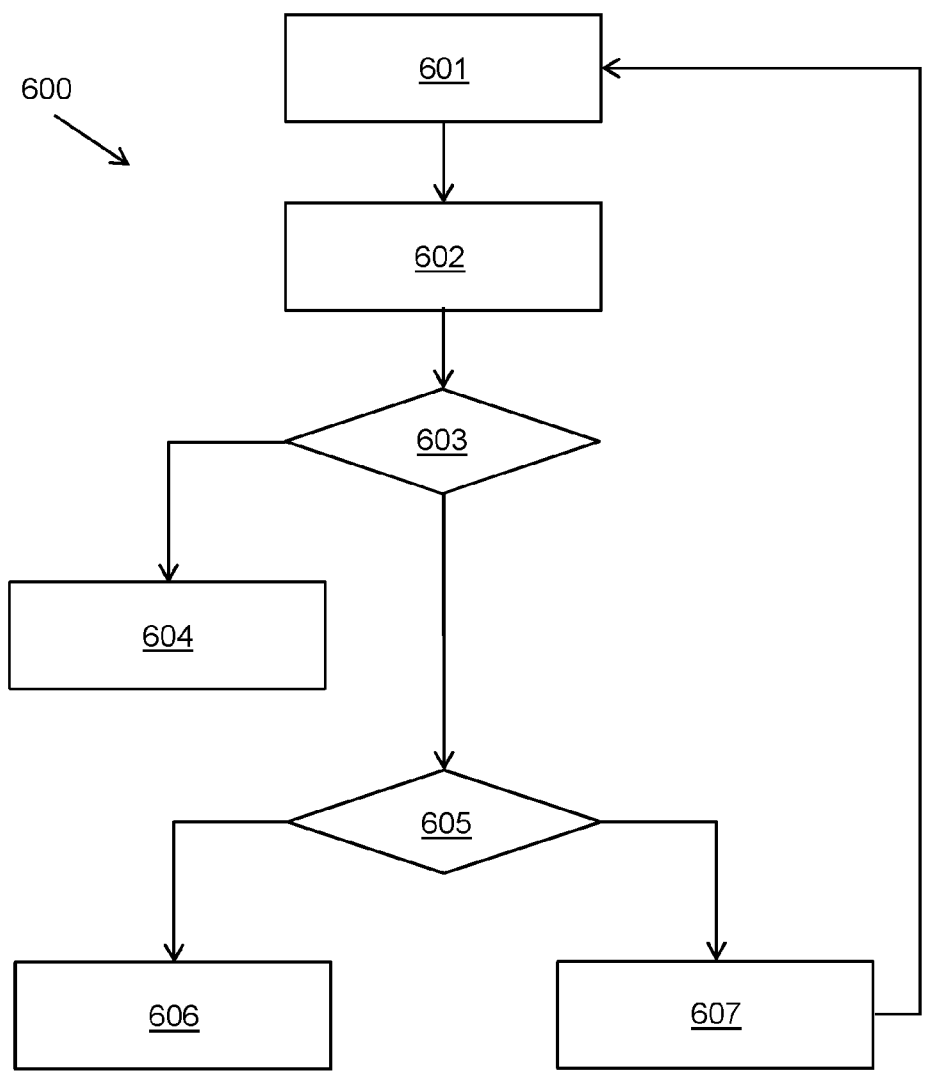
FIG. 6 illustrates an alternative example method of detecting faults in a register bank.

FIG. 6 shows an alternative example method 600, incorporating the stuck-at fault detection of method 500 with transient fault detection. Method 600 may be performed once a pre-determined time has elapsed since a previous run of method 600, or when the apparatus is in an idle mode.

At step 601, a first circular scan chain read-out is performed (i.e. shifting the parameter to an output of the register bank/chain, inverting the parameters, and feeding the inverted parameters back into the chain, as described above), and a first checksum calculated.

At step 602, a second circular scan chain read-out is performed (i.e. shifting the inverted parameters to the output, inverting the inverted parameters, and feeding the now non-inverted parameters back into the chain to restore the original contents of the chain, as described above), and a second checksum calculated.

At step 603, it is determined whether the first checksum equals a previously calculated first checksum. The previously calculated first checksum may be a first checksum calculated in a previous run of method 600, and may have been stored in a memory of the checksum determination element, hypervisor, or any other component capable of being accessed by the fault-detection apparatus.

If the first checksum does not equal the previously calculated first checksum, the method 600 proceeds to step 604, where it is determined that a fault, which may be a transient fault, exists in the register bank or a specific register chain. Corrective measures may be taken, such as those described above in relation to FIG. 1.

If the first checksum does equal the previously calculated first checksum, the method 600 proceeds to step 605. At step 605, it is determined whether the second checksum equals the inverse of the (current) first check sum.

If the second checksum does not equal the inverse of the first checksum, the method moves to step 606, wherein it is determined that a stuck-at fault exists in the register bank or in a specific register chain. Corrective measures may be taken, such as disabling any device which relies on the register bank or specific register chain containing the fault.

Alternatively, if the second checksum does equal the inverse of the first check sum, the method 600 may proceed to step 607, where the IC returns to an application mode, and the method 600 may be re-run, for example after a pre-determined period of time or when the apparatus is in an idle mode.

It is to be appreciated that determination step 605 may be performed before determination step 603 (i.e. the stuck-at fault determination may be performed before the transient fault determination).

From reading the present disclosure, other variations and modifications will be apparent to the skilled person. Such variations and modifications may involve equivalent and other features which are already known in the art of IC fault detection, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality and reference signs in the claims shall not be construed as limiting the scope of the claims.

The invention claimed is:

1. A method of detecting faults in a register bank, the register bank comprising a chain of registers, the method comprising:
   (i) sequentially shifting parameters stored in each register of the chain to an output node of the chain;
   (ii) inverting each of the parameters and in response feeding each parameter back to an input node of the chain;
   (iii) repeating steps (i) and (ii) to sequentially shift the inverted parameters through the chain until all the non-inverted parameters have been output at the output node;
   (iv) calculating a first checksum of the parameters output at the output node;
   (v) sequentially shifting the inverted parameters in each register of the chain to the output node of the chain;
   (vi) inverting each inverted parameter to restore the parameters as non-inverted parameters, feeding each of the non-inverted parameters back to the input node of that chain;
   (vii) repeating steps (v) and (vi) to sequentially shift the non-inverted parameters through the chain until all the inverted parameters have been output at the output node;
   (viii) calculating a second checksum of the inverted parameters output at the output node; and
   (ix) comparing the first and second checksums.

2. The method of claim 1, wherein calculating the first checksum comprises processing the parameters using a linear checksum algorithm; and
   wherein calculating the second checksum comprises processing the inverted parameters with the linear checksum algorithm.

3. The method of claim 2 wherein comparing the first and second checksums comprises:
   determining if the second checksum is the inverse of the first checksum; and
   if the first checksum is not the inverse of the second checksum, determining that a fault exists in the chain.

4. The method of claim 1, further comprising comparing the first checksum to a previously calculated first checksum.

5. The method of claim 4, wherein comparing the first checksum to the previously calculated first checksum comprises determining if the first checksum is equal to the previously calculated first checksum; and
   if the first checksum is not equal to the previously calculated first checksum, determining that a fault exists in the chain.

6. The method of claim 1, wherein the register bank comprises a plurality of chains of registers, and wherein:
   calculating the first and second checksums comprises calculating first and second checksums for each chain; or
   calculating the first check sum comprises calculating a checksum of the parameters output at the output nodes of all the chains, and calculating the second checksum comprises calculating a checksum of the inverted parameters output at the output nodes of all the chains.

7. The method of claim 1, wherein the method is performed after writing data to the register bank, and/or after a pre-determined period of time has elapsed since the method was last performed and/or when the register bank is in an idle mode.

8. An apparatus comprising:
   a register bank comprising at least one chain of registers comprising a plurality of registers serially connected in a chain, each register of the chain of registers configured to store a parameter, each of the at least one chain of registers having an input node at a first end and an output node at an opposed second end of the chain;
   a feedback arrangement comprising an inverter, the feedback arrangement configured such that each parameter provided at the output node is fed back via the inverter to the input node of that chain; and
   circuitry configured to calculate a checksum of the parameters of the at least one chain of registers provided at the output node;
   wherein the apparatus is configured to perform the method of claim 1.

9. The apparatus of claim 8, further comprising a circuit configured to receive first and second checksums from the circuitry, and to compare the first and second checksums.

10. The apparatus of claim 8, further comprising an electronic circuit configured to provide a sequential output of based on the parameters stored in the at least one register of the at least one chain of registers.

11. The apparatus of claim 8, wherein the register bank comprises a plurality of chains of registers.

12. The apparatus of claim 8, wherein the at least one chain of registers comprise one or more of flip-flops, latches, and dynamic storage elements.

* * * * *